US007868605B1

(12) United States Patent
Liu et al.

(10) Patent No.: US 7,868,605 B1
(45) Date of Patent: Jan. 11, 2011

(54) MIXED MODE POWER REGULATOR CIRCUITRY FOR MEMORY ELEMENTS

(75) Inventors: Ping-Chen Liu, Fremont, CA (US); Thien Le, San Jose, CA (US); Leo Min Maung, Fremont, CA (US)

(73) Assignee: Altera Corporation, San Jose, CA (US)

( * ) Notice: Subject to any disclaimer, the term of this patent is extended or adjusted under 35 U.S.C. 154(b) by 196 days.

(21) Appl. No.: 11/824,914

(22) Filed: Jul. 2, 2007

(51) Int. Cl.
*G05F 1/59* (2006.01)
*G05F 1/575* (2006.01)

(52) U.S. Cl. ................. 323/350; 323/268; 323/274; 323/284

(58) Field of Classification Search ............... 323/268, 323/273, 274, 275, 283, 284, 285, 224, 225, 323/282, 350
See application file for complete search history.

(56) References Cited

U.S. PATENT DOCUMENTS

| 4,473,759 | A | * | 9/1984 | Mahabadi | 327/68 |
| 4,797,584 | A | | 1/1989 | Aguti | |
| 4,816,740 | A | * | 3/1989 | Maier | 323/275 |
| 5,212,412 | A | | 5/1993 | Atriss | |
| 5,315,178 | A | * | 5/1994 | Snider | 326/44 |
| 5,371,709 | A | | 12/1994 | Fisher et al. | |
| 5,637,991 | A | | 6/1997 | Brown et al. | |
| 5,959,442 | A | * | 9/1999 | Hallberg et al. | 323/282 |
| 6,229,288 | B1 | * | 5/2001 | Baretich et al. | 323/223 |
| 6,229,289 | B1 | * | 5/2001 | Piovaccari et al. | 323/268 |
| 6,232,893 | B1 | | 5/2001 | Cliff et al. | |
| 6,256,681 | B1 | * | 7/2001 | Chang | 710/1 |
| 6,492,850 | B2 | * | 12/2002 | Kato et al. | 327/143 |
| 6,515,318 | B2 | | 2/2003 | Tsunai | |
| 6,717,831 | B2 | * | 4/2004 | Rhee et al. | 365/49.15 |
| 6,954,103 | B2 | | 10/2005 | Yamauchi | |
| 6,979,983 | B2 | | 12/2005 | Yen | |
| 7,151,656 | B2 | | 12/2006 | Dvorak et al. | |
| 7,205,807 | B2 | | 4/2007 | Svensson | |
| 7,253,596 | B2 | * | 8/2007 | Yamamoto et al. | 323/281 |
| 7,265,601 | B2 | * | 9/2007 | Ahmad | 327/403 |
| 7,508,177 | B2 | * | 3/2009 | Aiura et al. | 323/268 |

OTHER PUBLICATIONS

U.S. Appl. No. 11/799,228, filed Apr. 30, 2007, Vest et al.
Liu, Ping-Chen, U.S. Appl. 11/824,838, filed Jul. 2, 2007.

* cited by examiner

*Primary Examiner*—Gary L Laxton
(74) *Attorney, Agent, or Firm*—Treyz Law Group; G. Victor Treyz; Nancy Y. Ru

(57) ABSTRACT

Power regulator circuitry is provided for powering loads such as programmable memory element arrays on integrated circuits. The power regulator circuitry may have control circuitry that generates a first digital control signal to turn on and off a regulated power supply circuit and a second digital control signal to turn on and off a switch-based power supply circuit. The outputs of the regulated power supply circuit and switch-based power supply circuit may be connected to an output terminal for the power regulator circuitry. The first and second digital control signals may be used to ensure that the regulated power supply circuit is turned on before the switch-based power supply circuit is turned off. The switch-based power supply circuitry may contain serially connected transistors. The transistors may be turned off in an order that prevents latchup.

20 Claims, 11 Drawing Sheets

MIXED MODE POWER REGULATOR CIRCUITRY FOR MEMORY ELEMENTS

BACKGROUND

This invention relates to power regulator circuitry, and more particularly, to power regulator circuitry for powering volatile memory elements such as configuration random access memory elements on integrated circuits.

Integrated circuits such as programmable logic devices, programmable controllers, and other programmable integrated circuits often contain volatile memory elements. Typical volatile memory elements are based on cross-coupled inverters (latches) and are used to store data. Each memory element can store a single bit of data. These volatile memory elements are often used to store configuration data. Programmable logic devices, in particular, can be customized in relatively small batches to implement a desired logic design. In a typical scenario, a programmable logic device manufacturer designs and manufactures uncustomized programmable logic device integrated circuits in advance.

Later, a logic designer uses a logic design system to design a custom logic circuit. The logic design system uses information on the hardware capabilities of the manufacturer's programmable logic devices to help the designer implement the logic circuit using the resources available on a given programmable logic device.

The logic design system creates configuration data based on the logic designer's custom design. When the configuration data is loaded into the memory elements of one of the programmable logic devices, it programs the logic of that programmable logic device so that the programmable logic device implements the designer's logic circuit. The use of programmable logic devices can significantly reduce the amount of effort required to implement a desired integrated circuit design.

Conventional programmable logic device memory elements are powered at a constant positive power supply voltage. The positive power supply voltage that is used to power conventional programmable logic device memory elements is typically referred to as Vcc or Vcc-core and is the same power supply voltage used to power the core logic in the programmable logic device.

Integrated circuits such as programmable logic device integrated circuits that operate at low values of Vcc offer benefits over integrated circuits that operate at higher values of Vcc. For example, reductions in Vcc generally lead to reduced power consumption. Because of these benefits, the semiconductor industry is continually striving to produce processes and circuit designs that support reductions in Vcc. Previous generations of programmable logic devices operated at Vcc levels of 2.0 volts, 1.8 volts, and 1.5 volts. More recently, Vcc levels of 1.2 volts have been used in programmable logic devices. It is expected that future programmable logic devices will support Vcc levels of less than 1.2 volts (e.g., 1.1 volts or 1.0 volts).

The memory elements in a programmable logic device produce static output signals that reflect the configuration data that has been loaded into the memory elements. The static output signals drive the gates of n-channel and p-channel metal-oxide-semiconductor (MOS) transistors. Some of the transistors such as the n-channel transistors are used as pass transistors and are incorporated into multiplexers and other logic components. P-channel transistors are sometimes used as power-down transistors that prevent power from being applied to unused portions of an integrated circuit.

Both n-channel and p-channel transistors operate poorly when they are driven at insufficient voltages. For example, if the gate of an n-channel pass transistor receives a voltage that is too low, the transistor will not turn on properly and will degrade logic signals passing through the transistor. If the gate of a p-channel power-down transistor is too low, the transistor will not turn off properly and will exhibit an undesirably large leakage current.

Programmable memory element power supply voltages that are elevated with respect to the core logic power supply voltage on a programmable logic device may be used to improve performance. However, powering programmable memory elements with static elevated power supply voltages may adversely affect performance. For example, it may be difficult to load configuration data into such memory elements. As a result, a power supply for this type of memory element may need to operate at different voltage levels at different times. The power supply may, for example, be required to output one voltage during write operations and another voltage during normal operation.

It would be desirable to be able to provide power regulator circuitry that can exhibit good performance while meeting these time-varying voltage supply requirements.

SUMMARY

In accordance with the present invention, power regulator circuitry is provided for powering loads such as arrays of programmable memory elements on integrated circuits such as programmable logic device integrated circuits. The power regulator circuitry may have control circuitry that produces a reference voltage and first and second digital control signals. The power regulator circuitry may have a regulated power supply circuit that is turned on and off by the first digital control signal and may have a switch-based power supply circuit that is turned on and off by the second digital control signal. The regulated power supply circuit and switch-based power supply circuit may be connected to a common output line.

The power regulator circuitry may operate in multiple modes of operation. In one mode of operation, the regulated power supply circuit is turned off and the switch-based power supply circuit is turned on. The switch-based power supply circuit may have a digital switch that contains two serially connected p-channel metal-oxide-semiconductor transistors. The p-channel metal-oxide-semiconductor transistors may be connected between a positive power supply terminal and the output line. A stacked gate control circuit in the switch-based power supply circuit may generate first and second gate control signals based on the second digital control signal. The first and second gate control signals may be applied to the gates of the p-channel metal-oxide-semiconductor transistors. When turning off the digital switch, the stacked gate control circuit may control the order in which the first and second gate control signals are asserted to prevent latchup. Level shifter circuitry in the stacked gate control circuit may be disabled during power up operations using power-on-reset control signals.

In another mode of operation, the switch-based power supply circuit is turned off and the regulated power supply circuit is turned on. To prevent glitches in the output voltage on the output line, the control circuitry may assert the first digital control signal before deasserting the second digital control signal. This ensures that the regulated power supply circuit is turned on before the digital switch in the switch-based power supply circuit is turned off. When the regulated power supply circuit is turned on, the regulated power supply circuit produces an output voltage on the output line. The magnitude of the output voltage tracks the magnitude of the reference voltage that is produced by the control circuitry. The control circuitry may impose an offset voltage on the reference voltage during the transition between operating modes to enhance circuit stability.

Further features of the invention, its nature and various advantages will be more apparent from the accompanying drawings and the following detailed description.

DETAILED DESCRIPTION

Figure 1:
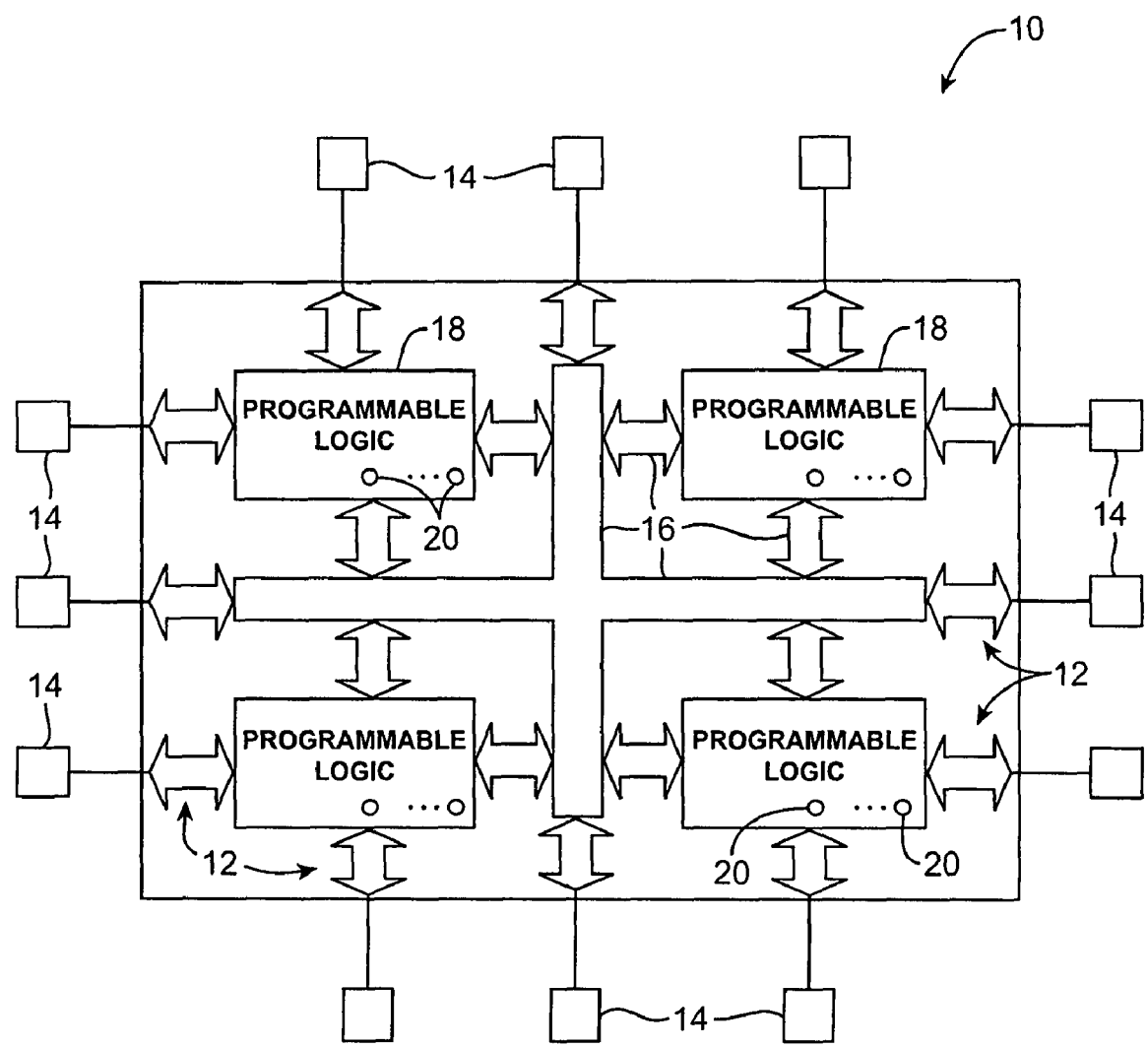
FIG. 1 is a diagram of an illustrative programmable logic device integrated circuit that may have power regulator circuitry for powering programmable logic device memory elements in accordance with an embodiment of the present invention.

The present invention relates to power regulator circuitry (also sometimes referred to as power supply circuitry or voltage regulator circuitry). In particular, the invention relates to power regulator circuitry such as power regulator circuitry that may be used to power memory elements in integrated circuits. The integrated circuits that contain the power regulator circuitry may be memory chips, digital signal processing circuits with memory arrays, microprocessors, application specific integrated circuits with memory arrays, programmable logic device integrated circuits in which memory elements are used for configuration memory, or any other suitable integrated circuits. For clarity, the present invention will generally be described in the context of programmable logic device integrated circuits in which programmable logic device memory elements are used to store configuration data and in which the regulator circuitry is used to provide power supply voltages for the memory elements.

During the programming of a programmable logic device, configuration data is loaded into the memory elements. During operation of the programmable logic device, each memory element provides a static output signal. The outputs signals from the memory elements are applied to programmable logic and customize the programmable logic to perform a desired logic function. In a typical arrangement, each static output signal serves as a control signal that is applied to the gate of an n-channel or p-channel metal-oxide-semiconductor transistor.

The programmable logic in which the n-channel and p-channel transistors are contained makes up part of the logic core of the programmable logic device and is therefore sometimes referred to as programmable core logic. Core logic is powered using a positive power supply voltage that is sometimes referred to as Vccd and a ground voltage that is sometimes referred to as Vss.

To reduce power consumption, there is an ongoing trend in the semiconductor industry to reduce the magnitude of core logic power supply voltages. Reducing the core logic power supply voltage on a chip reduces power consumption, but can lead to design challenges. For example, n-channel transistors in the programmable core logic can be difficult to turn on completely and p-channel transistors in the core logic can be difficult to turn off completely.

In accordance with the present invention, power regulator circuitry may be used to produce power supply voltages for the programmable memory elements on a programmable logic device integrated circuit. Each memory element may include a storage element formed from cross-coupled inverters. Each memory element may also include an address transistor and a clear transistor. During configuration data loading operations, the address transistors in the programmable logic device memory elements may be powered at an elevated power supply voltage (e.g., a voltage of 1.55 volts) and the storage elements in the programmable logic device memory elements may be powered at a lower power supply voltage such as Vccd. After the configuration data loading operations are complete, the power regulator circuitry can produce an elevated power supply voltage (e.g., a voltage Vccr of 1.55 volts) for powering the storage elements in the programmable logic device memory elements.

The power supply voltage that is used to power the address transistors in the programmable logic device memory elements may sometimes be referred to as an address transistor power supply voltage (Vccadd). Any suitable values may be used for the minimum and maximum voltage levels for Vccadd. With one suitable arrangement, the value of Vccadd may range from a low voltage of Vccd (e.g., 1.2 volts) to a high voltage of Vccr (e.g., 1.55 volts or another voltage in the range of about 1.5-1.7 volts). Arrangements involving a fixed value of Vccadd may also be used.

The power supply voltage that is used to power the storage elements in the programmable logic device integrated circuit is sometimes referred to as a storage element power supply voltage. The power regulator circuitry supplies an output voltage Vccout at its output that serves as the storage element power supply voltage. During clear operations, the value of Vccout may be low (e.g., 0.3 volts). During write operations, when data is being loaded into the memory elements, the value of Vccout may be Vccd (e.g., 1.2 volts). After configuration data has been loaded into the memory elements to program the programmable logic device to implement a desired logic function, the value of Vccout may be elevated to Vccr (e.g., 1.55 volts). In this mode of operation, which is sometimes referred to as user mode, the programmable logic device may be used in a system. During user mode, the elevated voltage output signals from the memory elements are applied to associated devices (e.g., pass transistors) to configure the programmable logic on the programmable logic device so that it performs its desired circuit functions.

The power regulator circuitry that is used to provide the power supply voltage Vccout may include two blocks of power supply circuitry: a regulated power supply circuit and a switch-based power supply circuit.

When operating the power regulator circuitry so that the voltage output Vccout is at the voltage Vccd, the switch-based power supply circuit may be turned on and the regulated power supply circuit may be turned off. In this mode of operation, power may be routed to the memory elements from an external power supply source through a digital switch in the switch-based power supply circuit. The digital switch may, as an example, be constructed from a pair of series-connected p-channel metal-oxide-semiconductor transistors.

When it is desired to increase the magnitude of Vccout to support user mode operations, the switch-based power supply circuit may be turned off and the regulated power supply circuit may be turned on. In this mode of operation, analog voltage regulation circuitry in the regulated power supply circuit may be used to supply Vccout. The analog voltage regulation circuitry may include a power transistor, a feedback path that feeds back the output voltage, and an operational amplifier that compares a reference voltage to the value of the signal that is fed back over the feedback path and that produces a corresponding control signal for the gate of the power transistor.

If proper care is not taken during the transitions between one of these modes of operation and the other, the transistors in the switch-based power supply circuit may experience latchup and glitches may be induced in the output voltage Vccout (e.g., due to the relatively slower response time of the regulated power supply circuit compared to the relatively quicker response time of the switch-based power supply circuit).

In accordance with the present invention, problems such as these may be avoided by using control circuitry that produces suitable control signals for the regulated power supply circuit and the switch-based power supply circuit. The control circuitry may produce control signals that ensure that there is a smooth transition between the different operating modes of the power regulator circuitry. The control circuitry may, as an example, stagger control signals that are supplied to the switch-based power supply circuit and the regulated power supply circuit to provide additional time for the regulated power supply circuit to respond. The circuitry may also provide control signals that turn off the series connected power transistors in the switch-based power supply circuit in an order that avoids potential latchup conditions from arising.

An illustrative programmable logic device 10 that may contain power regulator circuitry in accordance with the present invention is shown in FIG. 1.

Programmable logic device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Most of these transistors are generally n-channel metal-oxide-semiconductor (NMOS) pass transistors in programmable components such as multiplexers. When a memory element output is high, the pass transistor controlled by that memory element is turned on and passes logic signals from its input to its output. When the memory element output is low, the pass transistor is turned off and does not pass logic signals. P-channel metal-oxide-semiconductor (PMOS) transistors may also be controlled by the memory elements.

A typical memory element 20 has a storage element portion that is formed from a number of transistors configured as cross-coupled inverters. With one suitable approach, complementary metal-oxide-semiconductor (CMOS) integrated circuit technology is used to form the memory elements 20, so CMOS-based memory element implementations are described herein as an example. In the context of programmable logic device integrated circuits, the memory elements store configuration data and are therefore sometimes referred to as configuration random-access memory (CRAM) cells.

The memory elements may be loaded from any suitable source. With one illustrative arrangement, the memory elements are loaded from an external erasable-programmable read-only memory and control chip called a configuration device via pins 14 and input/output circuitry 12. The output signals from the loaded memory elements 20 are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc. The memory elements 20 are generally arranged in an array pattern. In a typical modern programmable logic device, there may be millions of memory elements 20 on each chip.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
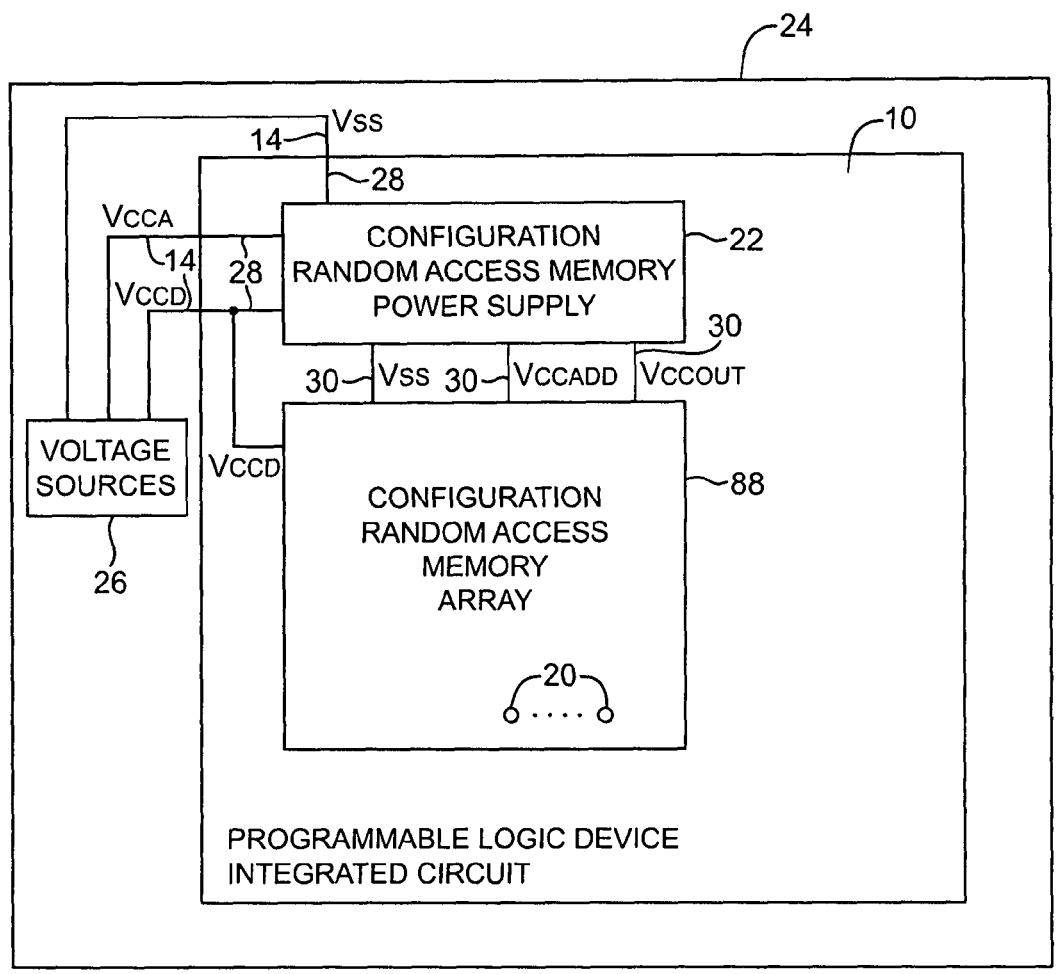
FIG. 2 is a diagram of an illustrative programmable logic device integrated circuit having configuration random access memory and a configuration random access memory power supply in accordance with an embodiment of the present invention.

As shown in FIG. 2, programmable logic device 10 may be mounted on a board 24 or other mounting structure in a system. External voltage sources such as voltage sources 26 may be located on board 24 or another board or portion of the system and may be used to supply power supply voltages such as Vss (e.g., 0 volts), Vcca (e.g., 2.5 volts), and Vccd (e.g., 1.2 volts) to programmable logic device 10 via pins 14.

Configuration random access memory power supply 22 may receive voltages Vss, Vcca, and Vccd as inputs on input paths such as paths 28. Configuration random access memory power supply 22 may supply corresponding power supply voltages Vss, Vccadd, and Vccout on output paths such as paths 30. The power supply voltage Vccadd may be used to power address drivers. The address drivers may supply address signals to address transistors in the programmable memory element cells 20 in array 88 via address lines. The power supply voltage Vccout may be used to power cross-coupled inverters in programmable memory element cells 20 in configuration random-access memory array 88.

Figure 3:
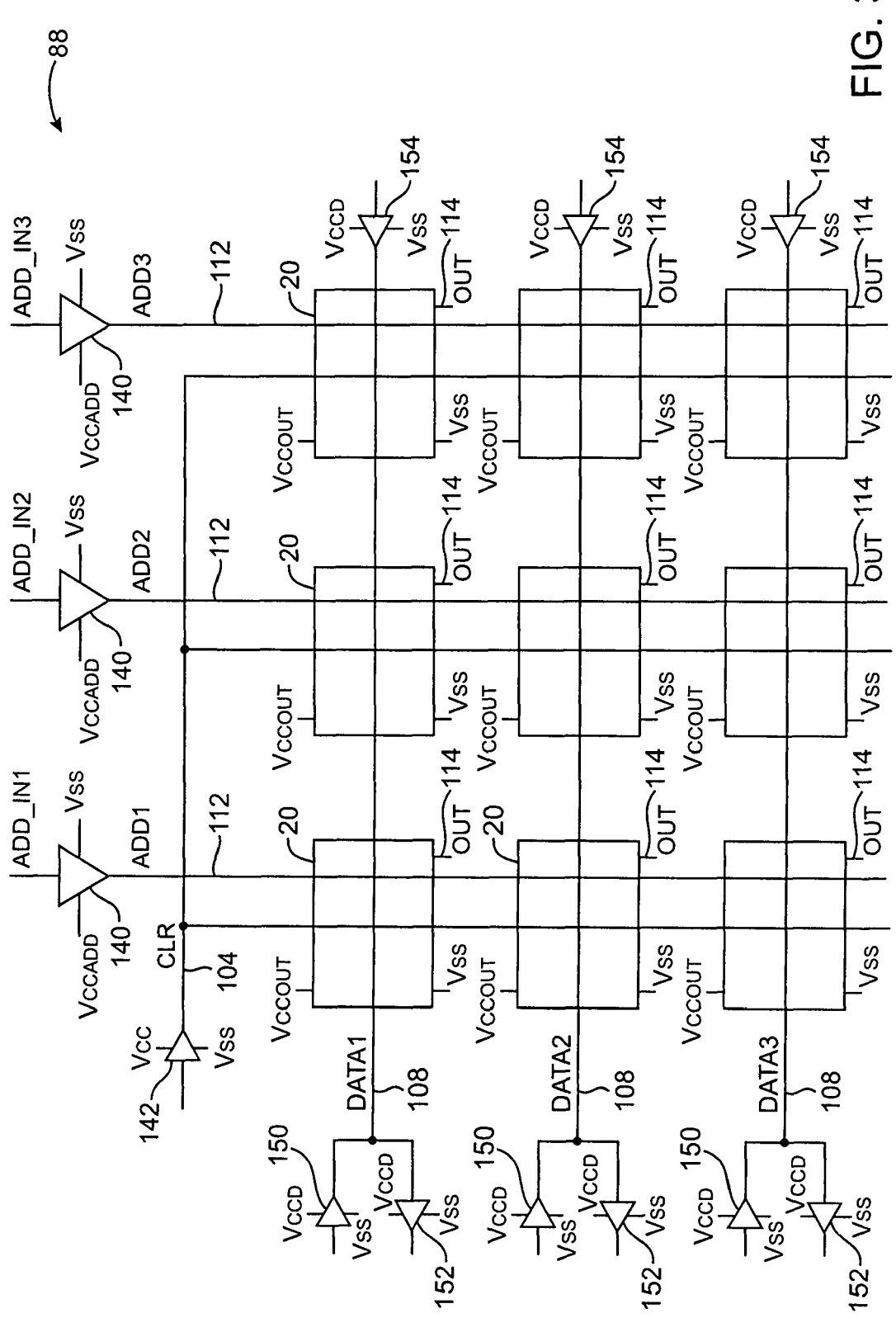
FIG. 3 is a diagram of an array of programmable logic device memory elements that may be powered using power regulator circuitry in accordance with an embodiment of the present invention.

Horizontal and vertical conductors and associated loading circuitry may be used to load the memory elements 20 in array 88 with configuration data. An illustrative array 88 of memory elements 20 is shown in FIG. 3. Address lines 112 are used to address array 88 as data is conveyed over data lines 108. Each address line 112 may have an associated address line driver 140. Drivers 140 may be powered with positive power supply voltage Vccadd and ground power supply voltage Vss (e.g., 0 volts). Each driver 140 may receive an address signal ADD_IN at its input and may produce a corresponding address signal ADD for one of lines 112 at its output.

Configuration data may be loaded into memory elements 20 in array 88 over data lines 108 as appropriate address lines 112 are asserted. Data input buffers 150 may be used to drive data onto lines 108 during write operations. During read operations, data may be read out of cells 20 via data lines 108 and read buffers 152. Precharge drivers 154 may be used to charge lines 108 to a predetermined voltage prior to read and write operations. Drivers 150, 152, and 154 may be powered at positive power supply voltage Vccd and ground power supply voltage Vss.

A clear signal CLR on clear line 104 may be used to clear the memory elements 20 in preparation for data loading operations. The clear signal CLR may be produced by a clear line driver 142 that is powered using positive power supply voltage Vccd and ground voltage Vss. If desired, array 88 may be cleared by powering up memory elements 20 to a low voltage Vccclr (e.g., 0.3 volts) while clear signal CLR is held high at Vccd. Each memory element 20 produces an output on a corresponding data output line 114.

Programmable logic device 10 contains core logic (e.g., hardwired logic and programmable logic 18 of FIG. 1). The core logic may be powered at positive power supply voltage Vccd and ground voltage Vss. Power regulator circuitry 22 (FIG. 2) may be powered using core logic power supply voltage Vccd, ground voltage Vss, and positive power supply voltage Vcca (e.g., a voltage that is larger than Vccd). With one suitable arrangement, Vccd may be 1.2 volts, Vss may be 0 volts, and Vcca may be 2.5 volts. Other arrangements may be used. For example, Vccd may be greater than or less than 1.2 volts, Vcca may be greater than or less than 2.5 volts, and Vss may be greater than or less than 0 volts. The use of a Vccd value of 1.2 volts, a Vcca value of 2.5 volts, and a Vss value of 0 volts is merely illustrative.

Power supply voltages such as Vccd, Vcca, and Vss may be supplied to circuitry on device 10 using any suitable arrangement. For example, power supply voltages such as Vccd, Vcca, and Vss may be received from one or more external power supply pins as shown in FIG. 2. Power supply voltages that are greater or less than the externally-supplied power supply voltages can be generated using on-chip circuitry. For example, a voltage divider may be used to reduce an externally-supplied voltage and a charge pump or other voltage boosting circuit may be used to generate a power supply voltage that is greater than an externally-supplied power supply voltage.

Data loading and reading circuitry on device 10 may be used to provide address, clear, and data signals to array 88. During writing operations, configuration data that is to be loaded into array 88 is supplied to data lines 108. During normal operation (user mode), the signals on output lines 114 are used to control associated programmable logic components.

The core logic on device 10 contains n-channel and p-channel metal-oxide-semiconductor transistors and programmable logic components formed from n-channel and p-channel metal-oxide-semiconductor transistors such as inverters, multiplexers, logic gates, register logic, look-up tables, etc. In a typical scenario, a circuit or component in programmable logic 18 has a positive power supply terminal that receives positive power supply voltage Vccd and a ground power supply terminal that receives ground power supply voltage Vss.

Power regulator circuitry 22 supplies ground power supply voltage Vss and positive power supply signals Vccadd and Vccout to the drivers and memory elements 20 of array 88. During normal operation, the value of Vccout is held at a voltage Vccr that is greater than Vccd (e.g., at a Vccr value of 1.55 volts). When the power supply voltage is elevated in this way (i.e., when the difference between the positive power supply voltage Vccr and the ground voltage Vss is larger than the difference between Vccd and Vss), the performance of the device 10 is enhanced. In particular, using an elevated power supply voltage makes it possible for the output control signals OUT from the memory elements 20 to more fully turn on n-channel transistors in the core logic of device 10 and to more fully turn off p-channel transistors in the core logic of device 10 than would otherwise be possible.

In general, an elevated power supply voltage may be implemented using an increased positive power supply voltage and/or a decreased ground power supply voltage. The introduction of power supply lines with different voltage levels into a programmable logic device architecture tends to add complexity. To avoid adding unnecessary complexity, it is may be desirable to limit the use of different power supply voltages. One suitable approach for limiting the number of power supply levels is to use the same ground voltage Vss to power array 88 that is used to the core logic and regulator circuitry on device 10. This type of arrangement is described as an example. If desired, however, other arrangements such as those in which the ground voltage for array 88 differs from the ground voltage for core logic 18 or the regulator circuitry may be used.

Power supply voltages Vccout, Vccadd, and Vss may be distributed to drivers 140 and memory elements 20 in memory element array 88 using any suitable scheme. For example, power supply voltage Vccout may be distributed to the memory elements in array 88 using a power distribution grid having interconnected columns and rows of power lines. In the example of FIG. 3, there are three rows and three columns of memory elements 20 in array 88. This is merely illustrative. Integrated circuits such as integrated circuit 10 may have any suitable number of memory elements 20. A typical memory array might, as an example, have thousands or millions of memory elements 20 arranged in hundreds or thousands or rows and columns.

The signal Vss is constant. The power supply signal Vccout preferably varies. For example, signal Vccout may vary between Vccd during write operations (where the relatively low voltage makes it easier to load data into elements 20) and Vccr during read operations (in which the relatively higher voltage makes it easier to ascertain the voltage levels on data lines 108). Use of a Vccout level equal to Vccr during normal operation may improve the performance of device 10. The power supply signal Vccadd may vary or may be constant. The power supply signal Vccadd may, as an example, vary between Vccr during write operations (where the increased voltage Vccr makes it easier to load data through the address transistors in elements 20) and Vccd during read operations (e.g., when reading data out of array 88 for testing).

Data loading and reading circuitry on device 10 controls clearing and data loading operations for array 88. The data loading and reading circuitry receives configuration data from external sources. In a typical system, configuration data is loaded into a programmable logic device from a memory and data loading circuit. This type of circuit, which is sometimes referred to as a configuration device, loads configuration data into registers within the data loading and reading circuitry. The data loading and reading circuitry produces clear signals on clear path 104 (labeled CLR). Asserting the signal CLR when powering up cells 20 clears the contents of the memory array 88. Clearing operations may be performed upon system power-up or during subsequent reconfiguration operations. After the array has been cleared, the CLR signal is deasserted and the configuration data is loaded.

Configuration data may be loaded into registers in the loading and reading circuitry. The registers may be used to apply the configuration data in parallel to array 88 via the DATA1, DATA2, and DATA3 lines 108. Address decoder circuitry may receive addressing information from an external source and, in response, may systematically assert and deassert desired address lines 112 (i.e., ADD1, ADD2, or ADD3). As the address line in each column is asserted, the data on the data lines 108 is loaded into the memory elements 20 in that column. By addressing each column in this way, the entire array 88 may be loaded with configuration data.

After the array has been loaded, proper data loading can be confirmed by reading out the data that has been programmed into memory elements 20. This operation, which is sometimes referred to as data confirmation, is used to ensure that no errors have occurred during the loading process. If the values of the confirmation data read out from array 88 do not match the values that were used during data loading, an error message may be generated, the loading process can be repeated, or other suitable corrective actions may be taken. Data reading operations may be performed periodically during normal operation to confirm that loaded configuration data remains valid.

During data read operations, data lines 108 are used as read lines. In particular, the DATA1, DATA2, and DATA3 lines 108 may be used to convey loaded configuration data values from a column of addressed memory elements 20 to registers in the data loading and reading circuitry.

Loaded configuration data is used to control the operation of the programmable logic on device 10, so that the device 10 can be used in a system. During normal operation (user mode operation), the output 114 of each memory element 20 produces a corresponding static control signal for controlling the gate of an NMOS transistor such as an NMOS pass transistor, a PMOS transistor such as a PMOS power-down transistor, or other circuit component in the programmable core logic 18 of the programmable logic device 10.

Figure 4:
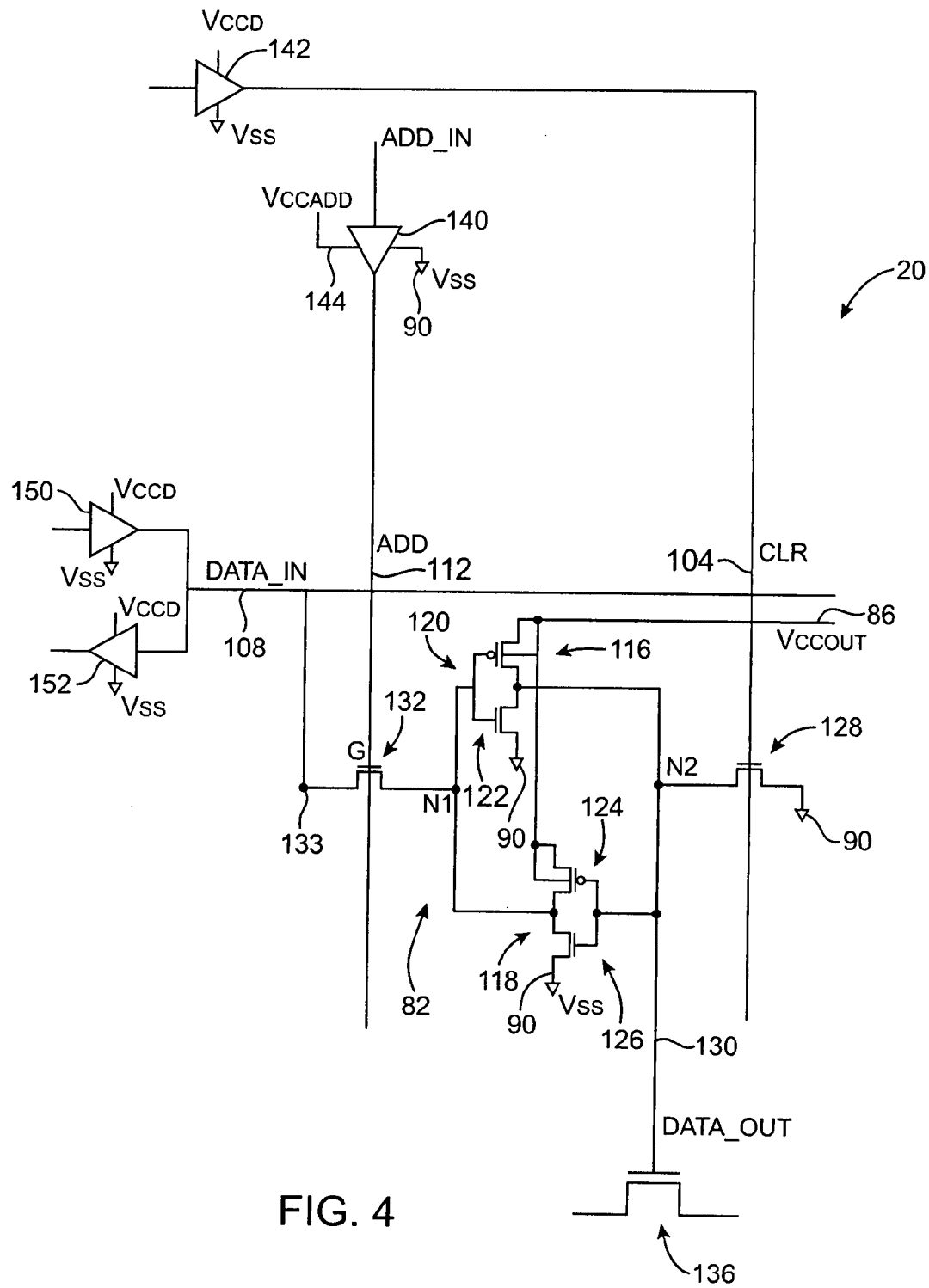
FIG. 4 is a diagram of an illustrative programmable logic device memory element that may be powered using regulator circuitry in accordance with an embodiment of the present invention.

An illustrative memory element 20 is shown in FIG. 4. Memory element 20 may be cleared by asserting the CLR signal on line 104 to turn on clear transistor 128 and thereby connect node N2 to ground terminal 90 as voltage Vccout is being ramped up.

During programming, memory element 20 receives data on DATA_IN line 108. After data has been loaded into the array, a data confirmation operation is performed to determine whether the data has been loaded properly. During data confirmation operations, the DATA_IN line serves as a verification pathway. When loading, data flows into the array 88 along lines 108. When performing data confirmation operations, data flows from the array 88 into registers in associated data loading and reading circuitry in the opposite direction along lines 108.

During both loading and reading operations, address signals ADD are systematically asserted on address lines 112. This allows the data loading and reading circuitry to address the columns of the array 88 for data writing or reading.

Storage element 82 of memory element 20 is formed from two cross-coupled inverters. Inverter 116 has transistors 120 and 122. Inverter 118 has transistors 124 and 126. Transistors 120 and 124 are p-channel metal-oxide-semiconductor transistors. Transistors 122 and 126 are re-channel metal-oxide-semiconductor transistors. The voltages on nodes N1 and N2 have opposite polarity. When N1 is low, N2 is high and the memory element 20 is said to be programmed. The content of a programmed memory element in this situation is a logic one. When N1 is high and N2 is low, the memory element contains a logic zero and is said to be cleared.

As shown in FIG. 4, the voltage on node N2 is the same as the DATA_OUT voltage. The DATA_OUT signal is applied to programmable core logic components such as transistor 136 over lines such as line 130 (shown as outputs 114 in FIG. 3).

Storage element 82 is powered using positive power supply voltage Vccout at terminal 86 and ground power supply Vss at ground terminal 90. Address drivers such as address driver 140 are powered using positive power supply voltage Vccadd at terminal 144 and ground power supply Vss at a ground terminal 90.

Figure 5:
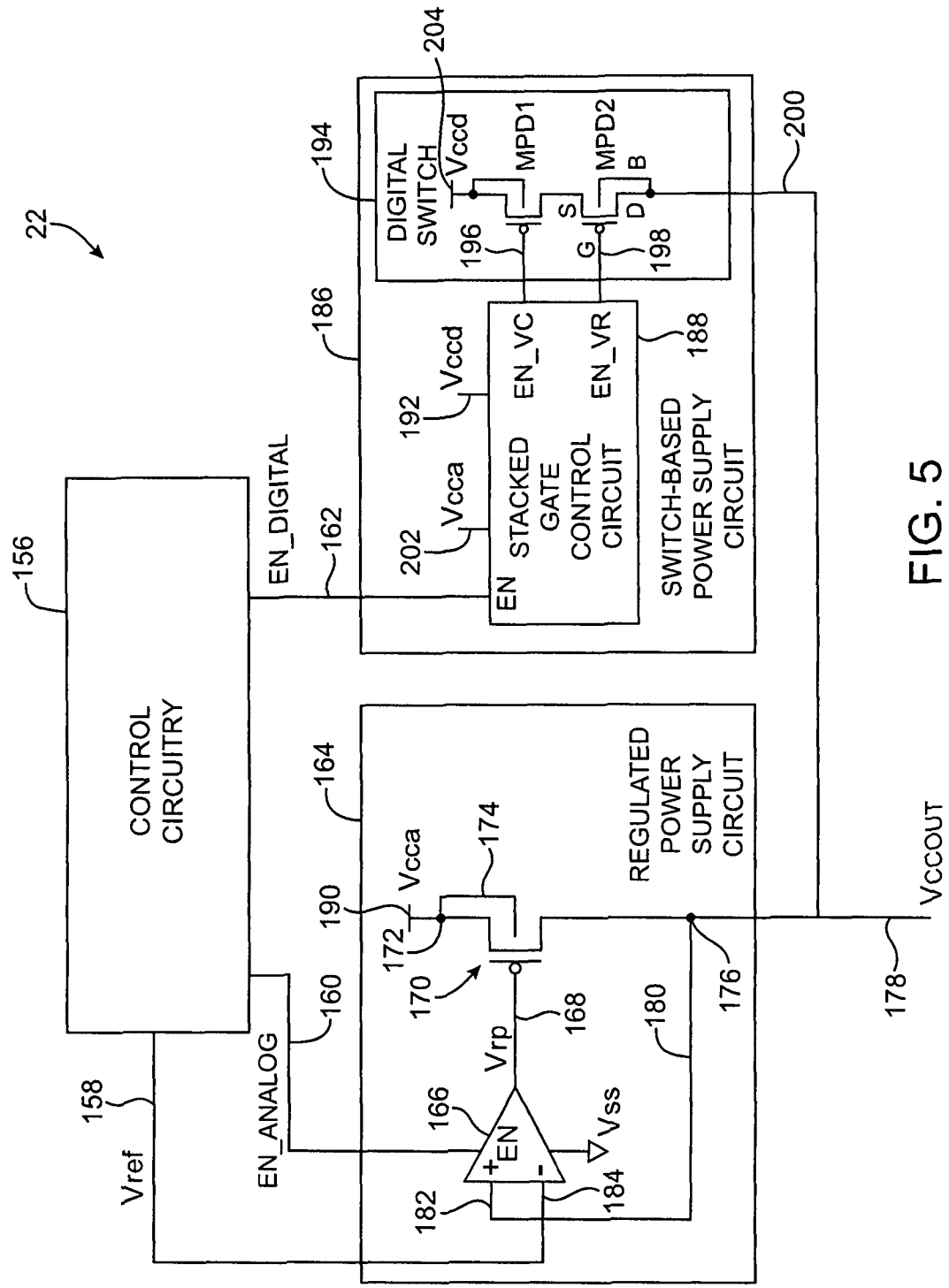
FIG. 5 is a diagram of illustrative power regulator circuitry in accordance with an embodiment of the present invention.

Illustrative power regulator circuitry 22 that may be used to generate the power supply voltages for device 10 is shown in FIG. 5. Power regulator circuitry 22 may have a regulated power supply circuit 164 and a switch-based power supply circuit 186. Depending on its mode of operation, power regulator circuitry 22 may use regulated power supply circuit 164 or switch-based power supply circuit 186 to supply power supply output voltage Vccout on output path 178. When regulated power supply circuit 164 is in operation, the power transistor 170 produces a regulated output power Vccout on output 178 based on the power supply voltage Vcca on terminal 190. Power transistor 170 may be formed by multiple parallel devices (e.g., a ring of devices) that surround array 88. When switch-based power supply circuit 186 is in operation, digital switch 194 is on and the power supply voltage Vccd on terminal 204 is conveyed to output line 178 via path 200. Digital switch 194 may be formed by one or more parallel sets of serially stacked transistors such as transistors MPD1 and MPD2.

The operation of power regulator circuitry 22 may be controlled by control circuitry 156. Control circuitry 156 may generate a reference voltage Vref on output line 158. The magnitude of Vref may control the magnitude of Vccout when power regulator circuit 22 is operated in its regulated output mode. The signal Vref may be conveyed to regulated power supply circuit 164 via path 158. Control circuitry 156 may also generate an enable (disable) control signal EN_ANALOG on path 160 and an enable (disable) control signal EN_DIGITAL control signal on path 162. To turn off switch-based power supply circuit 186, signal EN_DIGITAL is deasserted (e.g., taken low to Vss). When EN_DIGITAL is asserted (e.g., taken high to Vccd), switch-based power supply circuit 186 is turned on. When EN_ANALOG is deasserted (e.g., taken low to Vss), regulated power supply circuit 164 is off. When EN_ANALOG is asserted (e.g., taken high to Vcca), regulated power supply circuit 164 is on. Control circuitry 156 may control the states of circuits 164 and 186 depending on the mode of operation that is desired for power regulator circuit 22 (e.g., to support data loading or user mode operations for device 10).

Regulated power supply circuit 164 has an operational amplifier 166. The enable input EN of operational amplifier 166 is used to enable or disable operational amplifier 166 based on the state of signal EN_ANALOG. The output of operational amplifier 166 produces the signal Vrp on path 168. The signal Vrp is applied to the gate of p-channel metal-oxide-semiconductor transistor 170. The body terminal of transistor 170 is connected to node 172 via path 174.

When EN_ANALOG is low, operational amplifier 166 is disabled and the signal Vrp is forced high to Vcca. With Vrp at Vcca, the gate of transistor 170 is high and transistor 170 is off.

When EN_ANALOG is high, operational amplifier 166 is enabled and the components of circuit 164 form a low-dropout regulator. Feedback path 180 feeds the voltage on node 176 (i.e., the output voltage Vccout) to the positive input 182 of operational amplifier 166. Operational amplifier 166 receives reference voltage Vref at negative input 184. Operational amplifier 166 compares the voltages on inputs 182 and 184 and produces a corresponding output signal Vrp on path 168. If the voltage Vccout falls below Vref, the signal Vrp falls, turning on transistor 170 and increasing Vccout towards Vref. If the voltage Vccout rises above Vref, the signal Vrp rises, turning off transistor 170 and decreasing Vccout.

Switch-based power supply circuit 186 has a stacked gate control circuit 188. Control circuit 188 receives the signal EN_DIGITAL at its enable input EN from control circuitry 156 via path 162. Control circuit 188 receives power supply voltage Vcca on terminal 202 and receives power supply voltage Vccd on input 192. During operation, stacked gate control circuit 188 produces gate control signals EN_VC on path 196 and EN_VR on path 198 in response to the value of the EN_DIGITAL signal that is received on path 162. Digital switch 194 is controlled by the gate control signals EN_VC and EN_VR. The signal EN_VC is applied to the gate of p-channel metal-oxide-semiconductor transistor MPD1 via path 196. When EN_VC is high, transistor MPD1 is off. Transistor MPD1 is on when EN_VC is low. The signal EN_VR is applied to the gate of p-channel metal-oxide-semiconductor transistor MPD2 via path 198. Low values of EN_VR are used to turn on transistor MPD2, whereas high values of EN_VR are used to turn off transistor MPD2. The body terminal of transistor MPD1 is connected to power terminal 204. The body terminal of transistor MPD2 is connected to path 200.

Control circuit 188 may control the sequence in which signals EN_VC and EN_VR are generated to help prevent latchup conditions in the p-channel metal oxide transistors of digital switch 194.

Figure 6:
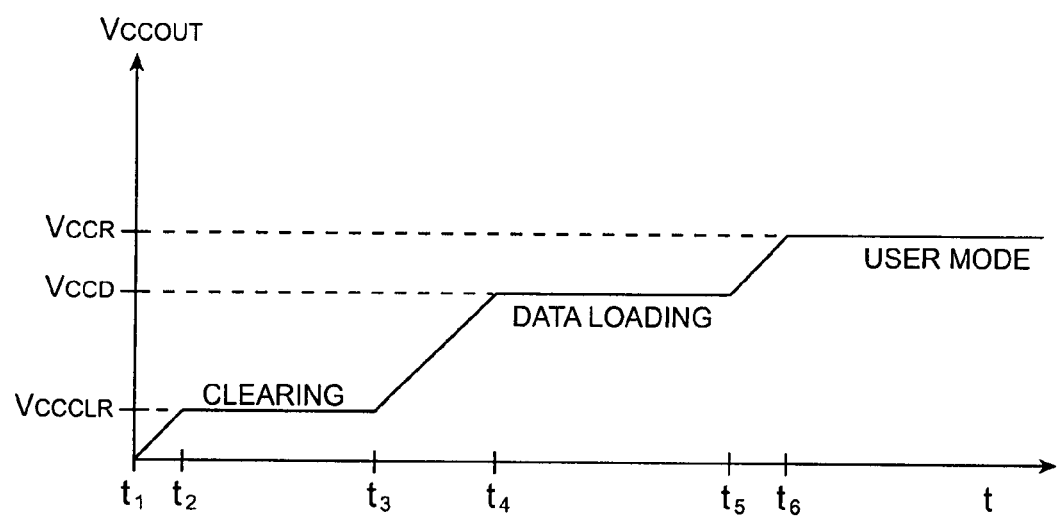
FIG. 6 is a graph showing illustrative output voltage levels that the illustrative power regulator circuitry of FIG. 5 may produce during different modes of operation in accordance with an embodiment of the present invention.

A graph showing how the value of Vccout on line 178 may be varied during use of device 10 is shown in FIG. 6. Device 10 is initially powered off. Following power-up operations, regulated power supply circuit 22 is turned on to provide output voltage Vccout (times t1 to t4). From times t1 to t2, the output voltage Vccout is ramped up. At times t2 to t3, power regulator circuit 22 holds the value of Vccout at a relatively low value Vccclr (e.g., 0.3 volts) while programmable memory elements 20 are cleared.

After clearing operations have been completed, power regulator circuitry 22 ramps up the voltage Vccout from Vccclr to Vccd (times t3 to t4). Between times t4 and t5, control circuitry 156 turns off regulated power supply circuit 164 and turns on switch-based power supply circuit 186 by generating a low EN_ANALOG signal and a high EN_DIGITAL signal. This turns on the digital switch 194 and connects the output line 178 to Vccd terminal 204. Accordingly, from times t4 to t5, the output voltage Vccout of voltage regulator 22 is held at Vccd, as shown in FIG. 6.

At time t5, control circuitry 156 turns on regulated power supply circuit 164 and turns off switch-based power supply circuit 186 by generating a high EN_ANALOG signal and a low EN_DIGITAL signal. This turns off the digital switch 194 and turns on operational amplifier 166 and regulated power supply circuit 164. In this mode of operation, the magnitude of output voltage Vccout is controlled by the magnitude of the reference voltage signal Vref that is supplied to regulated power supply circuit 164 via path 158. From time t5 to t6, the voltage Vccout is ramped up to elevated memory element power supply voltage Vccr (e.g., 1.55 volts). At times after t6, device 10 is in normal operation (user mode).

Figure 7:
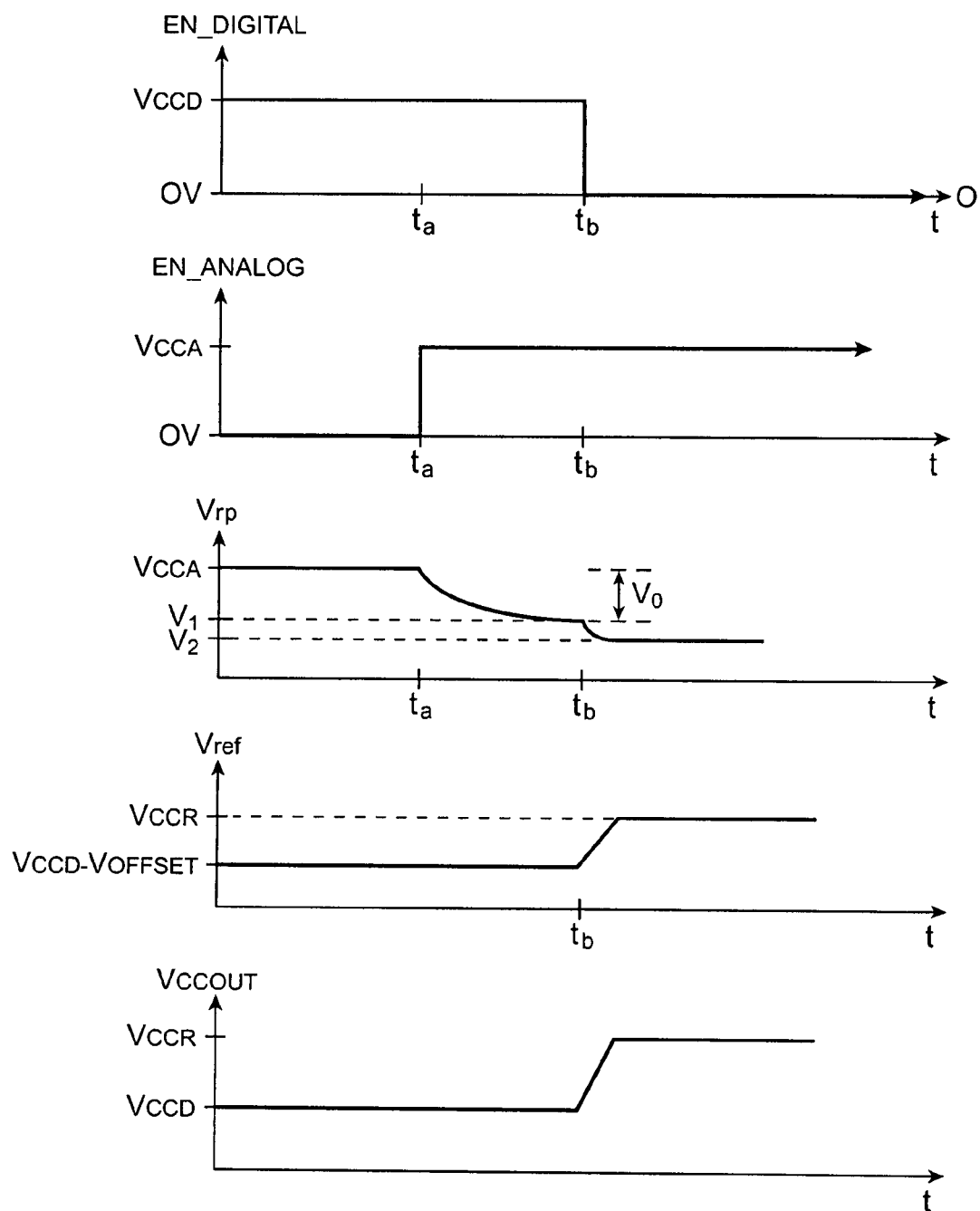
FIG. 7 includes graphs of control signals associated with operating power regulator circuitry in accordance with an embodiment of the present invention.

At time t5, there is a transition in which control circuitry 156 switches the power regulator circuitry 22 from a switch-based power supply mode of operation to a regulated power supply mode of operation. During this transition, control circuitry 156 preferably takes the signal EN_ANALOG high before taking the signal EN_DIGITAL low, as shown in FIG. 7. The analog circuitry of regulated power supply circuit 164 is generally slower to respond to control signals than the digital circuitry of switch-based power supply circuit 186. By asserting the signal EN_ANALOG before deasserting the signal EN_DIGITAL, control circuitry 156 creates an intentional overlap in the EN_ANALOG AND EN_DIGITAL signals. The overlap ensures that the analog circuitry of power supply circuit 164 is fully on and has reached steady state operation before the digital switch 194 is turned off. This allows droop in Vccout to be minimized.

As shown in the second trace of FIG. 7, the signal EN_ANALOG is taken from Vss to Vcca at time ta. As shown in the third trace of FIG. 7, as soon as EN_ANALOG goes high at time ta, operational amplifier 166 is enabled and the output signal Vrp starts to drop from Vcca toward its steady state value V2. By time tb, the signal Vrp has dropped by a voltage of V0. At time tb, EN_DIGITAL goes low, which turns off digital switch 194 and switch-based power supply circuit 186. The response time of digital switch 194 and switch-based power supply circuit 186 is generally much faster than the response time of regulated power supply 164. For example, regulated power supply 164 may respond on the order of microseconds, whereas switch-based power supply circuit 186 may respond on the order of nanoseconds. As a result, at time tb, switch-based power supply circuit shuts off nearly instantaneously.

The amount of overlap time tb-ta that is provided between control signals EN_DIGITAL and EN_ANALOG is preferably chosen to be sufficient to allow regulated power supply circuit to turn on and reach a steady state value. Typically the overlap time tb-ta is about 2 microseconds (e.g., 1-4 microseconds).

Process variations and operating temperature variations may affect the accuracy of operational amplifier 166. To ensure that circuitry 22 exhibits stable operation, control circuitry 156 may impose an offset voltage Voffset on the reference voltage Vref at times prior to time tb, as shown in the fourth trace of FIG. 7. The magnitude of the offset voltage Voffset may be about 5 mV (e.g., about 2-10 mV). The presence of the offset prevents the value of Vrp from dropping too low, even in the presence of process and temperature variations that affect the accuracy of operational amplifier 166.

When switch-based power supply circuit 186 is still on during the transition between using switch-based power supply circuit 186 and regulated power supply circuit 164, digital switch 194 forms a low resistance path between output path 178 and power supply terminal 204. Due to process and temperature variations, operational amplifier 166 might have a slightly inaccurate output, so Vccout might be larger in magnitude than desired (i.e., Vccout might be larger than Vccd). This could lead to a large current flowing from node 176 to power supply terminal 204 through digital switch 194, which in turn could cause ringing or other unstable circuit behavior in regulated power supply circuit 164. Because control circuitry 156 imposes the offset voltage Voffset on voltage Vref, the voltage Vccout is prevented from rising above Vccd at times prior to tb, thereby avoiding current flow from node 176 to power supply terminal 204 through digital switch 194.

At times after tb, the switch-based power supply circuit is turned off, so control circuitry 156 can remove the voltage Voffset from the reference voltage and can raise the reference voltage Vref to Vccr (e.g., 1.55 volts). During operation of regulated power supply circuit 164, the feedback loop formed by operational amplifier 166, transistor 170, and feedback path 180 causes the output voltage Vccout to track Vref. As shown in the fifth trace of FIG. 7, voltage Vccout on output path 178 tracks the reference voltage Vref as control circuitry 156 raises Vref from Vccd-Voffset (to support data loading operations) to Vccr (to support user mode operations).

Stacked gate control circuit 188 preferably controls the order in which stacked transistors MPD2 and MPD1 turn off to prevent latchup conditions (i.e., to prevent the forward biasing of the source-body junction in transistor MPD2). This might occur if transistor MPD1 is not turned off before transistor MPD2.

Figure 8:
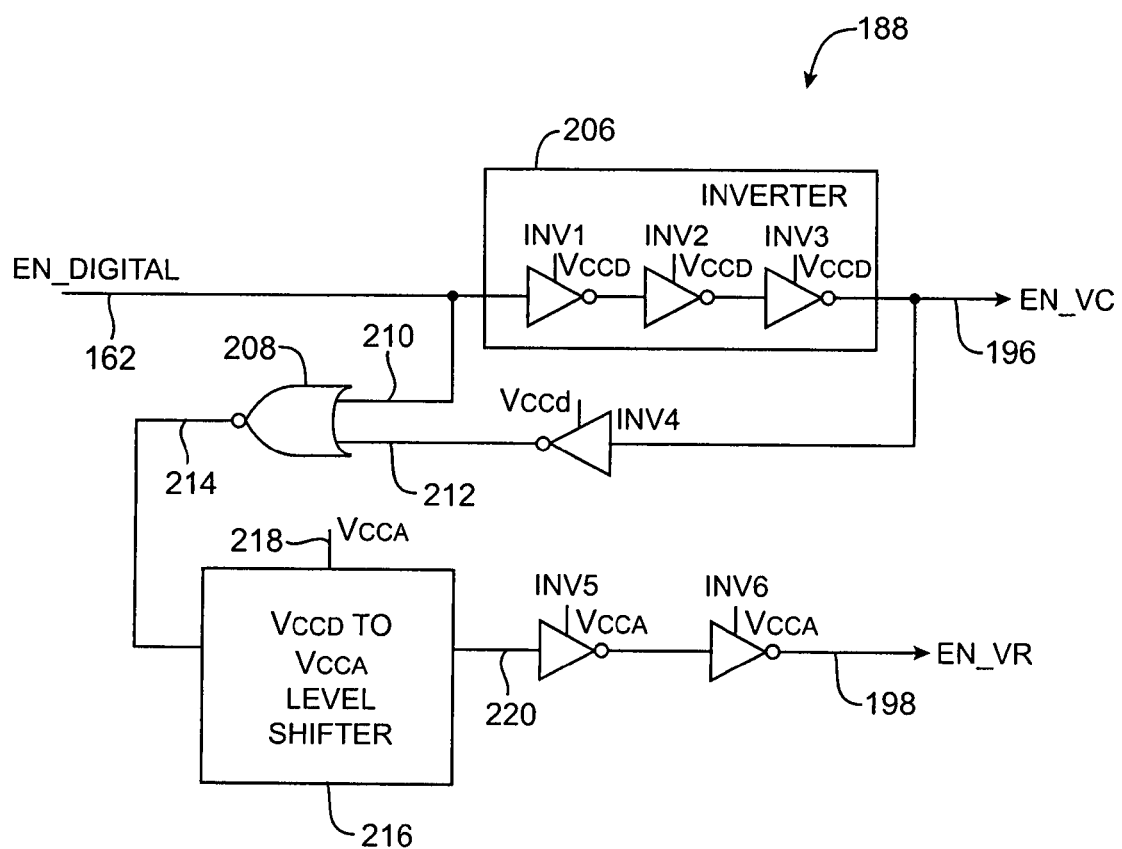
FIG. 8 is a diagram of control circuitry for use in controlling a digital switch in power regulator circuitry in accordance with an embodiment of the present invention.

An illustrative stacked gate control circuit 188 is shown in FIG. 8. As shown in FIG. 8, stacked gate control circuit 188 may receive the control signal EN_DIGITAL from control circuitry 156 (FIG. 5) on path 162. In response, stacked gate control circuit 188 may produce digital switch control signals EN_VC and EN_VR on outputs 196 and 198, respectively. Control circuit 188 may have an inverter such as inverter 206. Inverters such as inverter 206 may be formed from one or more inverter stages. In the example of FIG. 8, inverter 206 is formed from three smaller inverters INV1, INV2, and INV3. Inverter 206 is powered at voltage Vccd and is used to strengthen and invert control signal EN_DIGITAL. The strengthened and inverted version of control signal EN_DIGITAL is provided on output 196 as control signal EN_VC.

The signal EN_DIGITAL from input 162 is provided to input 210 of NOR gate 208. The other input 212 of NOR gate 208 receives the output of inverter INV4. Inverter INV4 inverts EN_VC back to its original form (EN_DIGITAL). There is a delay time t0 associated with inverter INV4, so the output of inverter INV4 is a delayed version of signal EN_DIGITAL. The output 214 of NOR gate 208 is low whenever either the signal on line 210 (the undelayed version of EN_DIGITAL) or the signal on line 212 (the delayed version of EN_DIGITAL) is high.

Control circuit 188 has a Vccd to Vcca level shifter 216 that is powered by power supply voltage Vcca on terminal 218. The output path between level shifter output 220 and control circuit output 198 may contain one or more buffers (e.g., inverters INV5 and INV6) that are powered at power supply voltage Vcca. With this arrangement, the output 220 of level shifter 216, the outputs of inverters INV5 and INV6, and therefore the output signal EN_VR on path 198 range between Vss and Vcca, whereas the output signal EN_VC on path 196 ranges between Vss and Vccd. The drain D of transistor MPD2 is exposed to a potentially high voltage Vccout (e.g., signal Vccr of 1.55 volts), so an arrangement of this type is preferred. The elevated signal level (Vcca) that is used for control signals EN_VR ensures that the voltage on the gate of transistor MPD2 will be sufficient to turn off transistor MPD2 fully, regardless of the voltage on the drain of MPD2.

Figure 9:
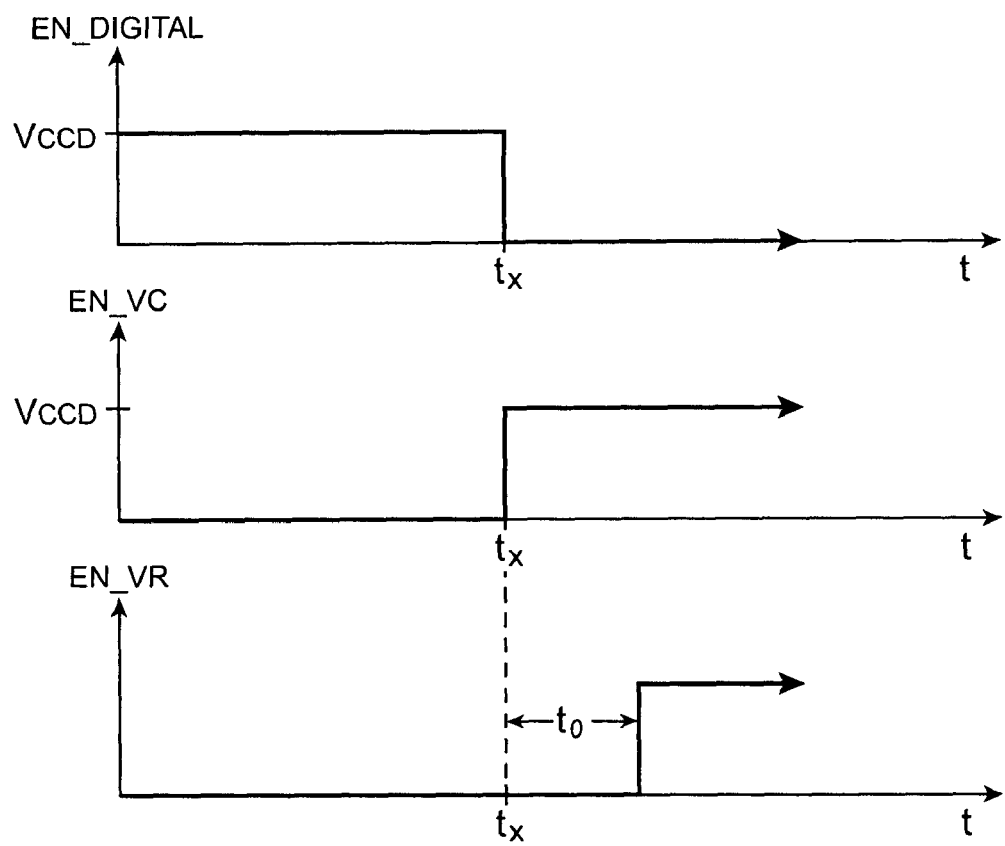
FIG. 9 includes graphs of signals associated with control circuitry of the type shown in FIG. 8 in accordance with an embodiment of the present invention.

The relationship between the input control signal EN_DIGITAL and the output control signals EN_VC and EN_VR is shown in FIG. 9. Initially, EN_DIGITAL is high, so the inverted version of EN_DIGITAL at output 196 (i.e., signal EN_VC) is low. With EN_DIGITAL high, the output of NOR gate 208 and therefore signal EN_VR are low.

As shown in the first trace of FIG. 9, input control signal EN_DIGITAL goes low at time tx. Inverter 206 inverts the signal EN_DIGITAL, so the signal EN_VC at output 196 is an inverted version of EN_DIGITAL and goes high at time tx, as shown in the second trace of FIG. 9. After a delay time of t0, the high signal EN_VC at the input to inverter INV4 results in a low signal at input 212 of NOR gate 208. With both input 210 and input 212 low, the output of NOR gate 208 goes high at time tx+t0, as shown in the third trace of FIG. 9.

The control circuitry 188 of FIG. 8 therefore delays the time at which signal EN_VR goes high relative to signal EN_VC. When signal EN_VC goes high, p-channel metal-oxide-semiconductor transistor MPD1 is turned off. When signal EN_VR goes high, p-channel metal-oxide-semiconductor transistor MPD2 is turned off. Because the control circuitry 188 takes EN_VC high before EN_VR, transistor MPD1 is turned off before transistor MPD2. Turning off transistor MPD1 before transistor MPD2 helps to prevent latchup conditions from arising in digital switch 194.

Figure 10:
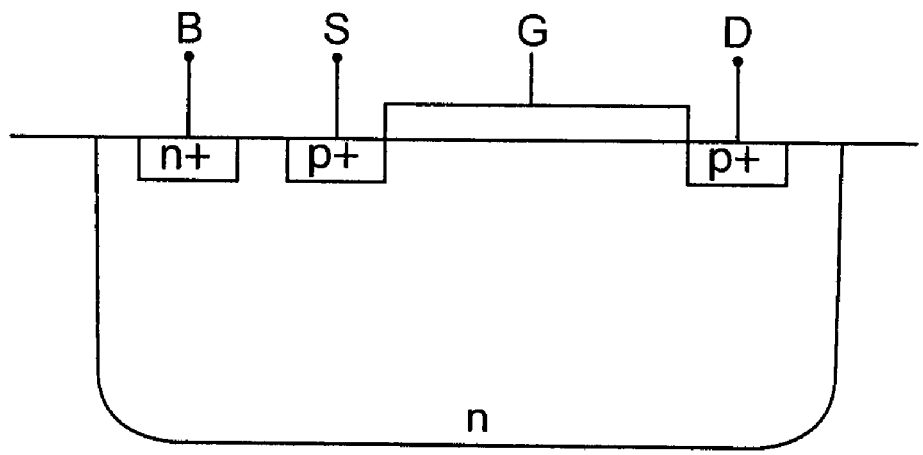
FIG. 10 is a cross-sectional diagram of a p-channel metal-oxide-semiconductor transistor in a digital switch in accordance with an embodiment of the present invention.

A cross-sectional view of p-channel metal-oxide-semiconductor transistor MPD2 is shown in FIG. 10. As shown in FIG. 10, transistor MPD2 has a body terminal B, a gate terminal G, a source terminal S, and a drain terminal D. (The sources and drains of metal-oxide-semiconductor transistors are sometimes referred to collectively as "source-drains.") Even when using the overlap control signal arrangement described in connection with FIG. 7, there may be minor glitches on power supply output line Vccout during the transition between using switch-based power supply circuit 186 and regulated power supply circuit 164. These glitches may momentarily reduce the value of Vccout relative to Vccd. By turning off transistor MPD1 before turning off MPD2, transistor MPD2 is isolated from the power supply Vccd on terminal 204. If MPD1 were not turned off before turning off MPD2, a glitch on Vccout might reduce the voltage on path 200 and body terminal B of transistor MPD2 below the voltage on terminal S of transistor MPD2. This might cause a latchup condition by forward biasing the p-type source terminal S relative to the n-type body terminal B in transistor MPD2. Stacked gate control circuit 188 may be used to prevent latchup by controlling the order in which signals EN_VC and EN_VR go high in response to a falling EN_DIGITAL signal, as described in connection with FIG. 9.

Figure 11:
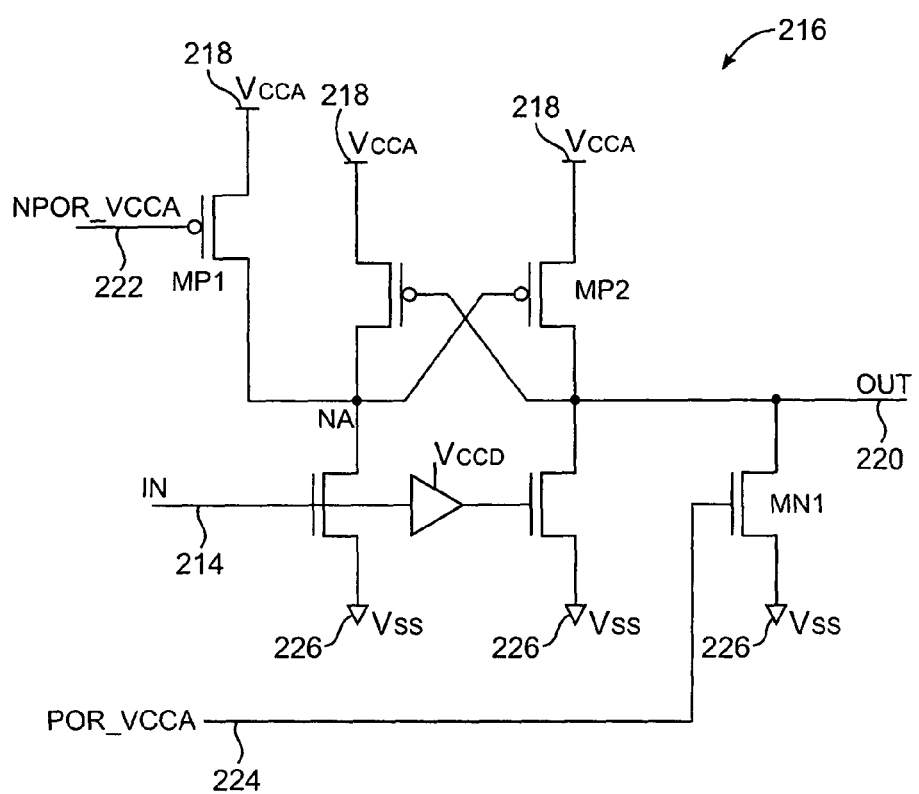
FIG. 11 is a diagram of level shifter circuitry for use in control circuitry of the type shown in FIG. 8 in accordance with an embodiment of the present invention.

Any suitable level shifter circuitry may be used for the level shifter 216 of FIG. 8. An illustrative level shifter 216 is shown in FIG. 11. In the example of FIG. 11, level shifter 216 has inputs 222 and 224 that receive power-on-reset control signals. Power-on-reset control signal POR_VCCA is applied to the gate of n-channel metal-oxide-semiconductor transistor MN1. An inverted version of this power-on-reset control signal (NPOR_VCCA) is applied to the gate of p-channel metal-oxide-semiconductor transistor MP1. The power-on-reset signals ensure that the output signal OUT on line 220 is low during power-up operations.

Level shifter 216 is powered with positive power supply voltage Vcca at terminals 218 and ground voltage Vss at terminals 226. During power-up operations, the voltage Vcca might power up before the voltage Vccd powers up. In this situation, the voltage on terminals 218 might become valid before the input signal IN on line 214 (from the output of NOR gate 208 in FIG. 8) is valid. In this situation, the states of inverters INV1, INV2, INV3, and INV4 and therefore the state of signal IN are unknown. With the state of signal IN unknown, the state of signal OUT will be unknown unless the level shifter 216 is disabled. An OUT signal with an unknown state during power up could inappropriately turn on digital switch 194 during power-up operations. Power-on-reset signals POR_VCCA and NPOR_VCCA are therefore used to disable level shifter 216 during power up. Signal NPOR_VCCA is held low during power up, which turns on p-channel metal-oxide-semiconductor transistor MP1 and pulls node NA to Vcca. With node NA high, transistor MP2 is turned off. When signal NPOR_VCCA is low, signal POR_VCCA is high. The high POR_VCCA signal is applied to the gate of transistor MN1. This turns on transistor MN1 and pulls output OUT low to a known state (Vss) at terminal 226. Once the power supply signal Vcca has powered up sufficiently, POR_VCCA goes low and NPOR_VCCA goes high. This turns off transistors MP1 and MN1 and enables level shifter 216 for normal operation. In normal operation, input signals IN on input line 214 that range from Vss to Vccd are converted into output signals OUT on output line 220 that range from Vss to Vcca.

The foregoing is merely illustrative of the principles of this invention and various modifications can be made by those skilled in the art without departing from the scope and spirit of the invention.

What is claimed is:

1. Power regulator circuitry on an integrated circuit, comprising:
    an output at which a regulated output voltage is provided;
    a regulated power supply circuit that is connected to the output and that is turned on and off using a first digital control signal;
    a switch-based power supply circuit that is connected to the output and that is turned on and off using a second digital control signal; and
    control circuitry that deasserts the second digital control signal to turn off the switch-based power supply circuit only after asserting the first digital control signal to turn on the regulated power supply circuit, wherein the regulated power supply circuit comprises an operational amplifier having an enable input, wherein the enable input of the operational amplifier receives the first digital control signal, and wherein the switch-based power supply circuit comprises:
    a digital switch containing a plurality of serially connected transistors each of which has a gate;
    a gate control circuit that receives the second digital control signal and that generates corresponding gate control signals for the gates of the transistors; and
    a level shifter in the gate control circuit that receives the second digital control circuit and that outputs at least one of the gate control signals.

2. The power regulator circuitry defined in claim 1 wherein the regulated power supply circuit further comprises:
    a transistor having a gate that receives an output signal from the operational amplifier.

3. The power regulator circuitry defined in claim 1, wherein the operational amplifier has first and second signal inputs and wherein the regulated power supply circuit further comprises:
    a transistor having a gate that receives an output signal from the operational amplifier and having a terminal connected to the output; and
    a feedback path that connects the output to the first signal input.

4. The power regulator circuitry defined in claim 1, wherein the operational amplifier has first and second signal inputs and wherein the regulated power supply circuit further comprises:
    a transistor having a gate that receives an output signal from the operational amplifier and having a terminal connected to the output; and
    a feedback path that connects the output to the first signal input, wherein the control circuitry produces a time-varying reference voltage that is applied to the second signal input of the operational amplifier.

5. The power regulator circuitry defined in claim 1 wherein the switch-based power supply circuit comprises:
    a positive power supply terminal, wherein the digital switch is connected between the positive power supply terminal and the output.

6. The power regulator circuitry defined in claim 1 wherein the switch-based power supply circuit comprises a positive power supply terminal, wherein the digital switch is connected between the positive power supply terminal and the output, wherein the operational amplifier has first and second signal inputs, and wherein the regulated power supply circuit further comprises:
    a transistor having a gate that receives an output signal from the operational amplifier and having a terminal connected to the output; and
    a feedback path that connects the output to the first signal input, wherein the control circuitry produces a time-varying reference voltage that is applied to the second signal input of the operational amplifier.

7. The power regulator circuitry defined in claim 1 wherein the switch-based power supply circuit comprises a positive power supply terminal, wherein the digital switch is connected between the positive power supply terminal and the output, wherein the operational amplifier has first and second signal inputs, and wherein the regulated power supply circuit further comprises:
    a transistor having a gate that receives an output signal from the operational amplifier and having a terminal connected to the output; and
    a feedback path that connects the output to the first signal input, wherein the control circuitry produces a time-varying reference voltage that is applied to the second signal input of the operational amplifier and wherein during a transition in which the control circuitry turns off the switch-based power supply circuit and turns on the regulated power supply circuit, the control circuitry takes the first control signal high before taking the second control signal low.

8. The power regulator circuitry defined in claim 1 wherein the switch-based power supply circuit comprises:
a positive power supply terminal that receives a positive power supply voltage, wherein the digital switch is connected between the positive power supply terminal and the output, wherein the operational amplifier has first and second signal inputs and wherein the regulated power supply circuit further comprises:
a transistor having a gate connected to the output terminal of the operational amplifier, wherein during a transition in which the control circuitry turns off the switch-based power supply circuit and turns on the regulated power supply circuit, the control circuitry takes the first control signal high before taking the second control signal low and takes the reference voltage to a value that is offset by at least one millivolt below the positive power supply voltage.

9. The power regulator circuitry defined in claim 1 wherein the switch-based power supply circuit comprises:
a positive power supply terminal, wherein the plurality of serially connected transistors comprises:
a first p-channel metal-oxide-semiconductor transistor that is connected to the positive power supply terminal and that has a first gate;
a second p-channel metal-oxide-semiconductor transistor that is connected between the first p-channel metal-oxide-semiconductor transistor and the output and that has a second gate, wherein the gate control signals comprise a first gate control signal for the first gate and a second gate control signal for the second gate and wherein when the control circuitry uses the second digital control signal to turn off the switch-based power supply circuit, the stacked gate control circuit takes the first gate control signal high before taking the second gate control signal high.

10. Power regulator circuitry on an integrated circuit, comprising:
an output at which a regulated output voltage is provided;
a regulated power supply circuit that is connected to the output and that is turned on and off using a first digital control signal;
a switch-based power supply circuit that is connected to the output and that is turned on and off using a second digital control signal; and
control circuitry that deasserts the second digital control signal to turn off the switch-based power supply circuit only after asserting the first digital control signal to turn on the regulated power supply circuit, wherein the switch-based power supply circuit comprises:
a digital switch containing a plurality of serially connected transistors each of which has a gate;
a gate control circuit that receives the second digital control signal and that generates corresponding gate control signals for the gates of the transistors; and
a level shifter in the gate control circuit that receives the second digital control signal and that outputs at least one of the gate control signals, wherein the level shifter has at least one input that receives a power-on-reset control signal.

11. Power regulator circuitry on an integrated circuit, comprising:
an output at which a regulated output voltage is provided;
a regulated power supply circuit that is connected to the output and that is turned on and off using a first digital control signal; and
a switch-based power supply circuit that is connected to the output and that is turned on and off using a second digital control signal; and
control circuitry that produces the first and second digital control signals, wherein the switch-based power supply circuit comprises:
a positive power supply terminal;
a first p-channel metal-oxide-semiconductor transistor that is connected to the positive power supply terminal and that has a first gate;
a second p-channel metal-oxide-semiconductor transistor that is connected between the first p-channel metal-oxide-semiconductor transistor and the output and that has a second gate; and
a stacked gate control circuit that receives the second digital control signal and that produces a first gate control signal for the first gate and a second gate control signal for the second gate, wherein when the control circuitry uses the second digital control signal to turn off the switch-based power supply circuit, the stacked gate control circuit takes the first gate control signal high before taking the second gate control signal high, wherein the stacked gate control circuit comprises a level shifter that outputs the second gate control signal and wherein the level shifter has at least one input that receives a power-on-reset control signal.

12. The power regulator circuitry defined in claim 11 wherein the regulated power supply circuit comprises an operational amplifier having an enable input that receives the first digital control signal, wherein the control circuitry deasserts the second digital control signal to turn off the switch-based power supply circuit only after asserting the first digital control signal to turn on the regulated power supply circuit.

13. A switch-based power supply circuit comprising:
a digital switch containing a plurality of serially connected transistors each of which has a gate;
an output at which an output voltage is provided by the digital switch;
a gate control circuit that receives a control signal and that generates corresponding gate control signals for the gates of the transistors, wherein the switch-based power supply circuit is turned on and off using the control signal; and
a level shifter in the gate control circuit that receives the control signal and that outputs at least one of the gate control signals.

14. The switch-based power supply circuit defined in claim 13, further comprising a logic circuit having an associated delay time, wherein the logic circuit has an output that is connected to the input of the level shifter.

15. The switch-based power supply circuit defined in claim 13, wherein the level shifter comprises at least one input that receives a power-on-reset signal.

16. The switch-based power supply circuit defined in claim 13, further comprising:
a positive power supply line connected to at least one of the plurality of serially connected transistors, wherein the positive power supply line has a positive power supply voltage; and
an elevated power supply line connected to the level shifter, wherein the elevated power supply line has an elevated power supply voltage and wherein the elevated power supply voltage is greater than the positive power supply voltage.

17. The switch-based power supply circuit defined in claim 16, wherein the first and second transistors comprise first and second p-channel metal-oxide-semiconductor transistors.

18. The switch-based power supply circuit defined in claim 17, wherein the level shifter comprises an output that supplies the second gate control signal to the second gate.

19. The switch-based power supply circuit defined in claim 13, further comprising a positive power supply terminal, wherein the plurality of serially connected transistors is connected between the positive power supply terminal and the output.

20. The switch-based power supply circuit defined in claim 19, wherein the plurality of serially connected transistors comprises:
- a first transistor that is connected to the positive power supply terminal and that has a first gate; and
- a second transistor that is connected between the first transistor and the output and that has a second gate, wherein the gate control signals comprise a first gate control signal for the first gate and a second gate control signal for the second gate.

* * * * *